(12) United States Patent
Wang et al.

(10) Patent No.: US 10,720,730 B2
(45) Date of Patent: Jul. 21, 2020

(54) CARD EDGE CONNECTOR HAVING METALLIC MEMBER FORMED INTEGRALLY WITH INSULATIVE HOUSING

(71) Applicant: FOXCONN INTERCONNECT TECHNOLOGY LIMITED, Grand Cayman (KY)

(72) Inventors: Xin-Wei Wang, Huaian (CN); Guo-Xiang Niu, Huaian (CN)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 40 days.

(21) Appl. No.: 15/877,360

(22) Filed: Jan. 22, 2018

(65) Prior Publication Data

US 2018/0212362 A1 Jul. 26, 2018

(30) Foreign Application Priority Data

Jan. 21, 2017 (CN) .......................... 2017 1 0048139

(51) Int. Cl.
*H01R 13/627* (2006.01)
*H01R 12/70* (2011.01)
(Continued)

(52) U.S. Cl.
CPC ..... *H01R 13/6275* (2013.01); *H01R 12/7005* (2013.01); *H01R 12/7029* (2013.01);
(Continued)

(58) Field of Classification Search
CPC .............. H01R 12/721; H01R 12/7005; H01R 12/7029; H01R 12/716; H01R 13/6581;
(Continued)

(56) References Cited

U.S. PATENT DOCUMENTS

| 5,478,259 A | * | 12/1995 | Noschese | ............. | H01R 13/658 |
| | | | | | 439/607.31 |
| 5,564,931 A | * | 10/1996 | Fabian | .................. | H01R 12/62 |
| | | | | | 439/62 |

(Continued)

FOREIGN PATENT DOCUMENTS

CN 2884569 Y 3/2007
CN 107204534 A 9/2017

*Primary Examiner* — Edwin A. Leon
*Assistant Examiner* — Matthew T Dzierzynski
(74) *Attorney, Agent, or Firm* — Wei Te Chung; Ming Chieh Chang

(57) ABSTRACT

A card edge connector includes an elongated insulative housing, a number of terminals retained to the housing, and a metallic member formed integrally with the housing via an insert-molding process. The housing includes two lengthwise walls, a central slot defining by the two lengthwise walls, and two protrusions located at two opposite ends of the two lengthwise walls. The protrusions protrude upwardly out of an upper surface of the lengthwise walls. The metallic member includes two main portions retained respectively in the two lengthwise walls and a pair of connecting portions connecting therebetween. The connecting portions are located at the bottom of the metallic member.

20 Claims, 10 Drawing Sheets

(51) Int. Cl.

| | |
|---|---|
| *H01R 13/6587* | (2011.01) |
| *H01R 13/629* | (2006.01) |
| *H05K 5/02* | (2006.01) |
| *H01R 12/72* | (2011.01) |
| *H01R 12/73* | (2011.01) |
| *H01R 12/71* | (2011.01) |
| *H01R 33/97* | (2006.01) |
| *H01R 43/26* | (2006.01) |

(52) U.S. Cl.
CPC ... *H01R 13/62988* (2013.01); *H01R 13/6587* (2013.01); *H01R 33/97* (2013.01); *H01R 43/26* (2013.01); *H05K 5/0295* (2013.01); *H01R 12/716* (2013.01); *H01R 12/721* (2013.01); *H01R 12/737* (2013.01)

(58) Field of Classification Search
CPC .............. H01R 12/737; H01R 13/6594; H01R 12/707; H01R 13/6587; H01R 13/7172; H01R 12/52; H01R 12/58; H01R 12/7023; H01R 12/7076; H01R 12/73; H01R 13/4226; H01R 13/5025; H01R 13/6275; H01R 13/629; H01R 13/62988; H01R 13/639; H01R 13/64; H01R 13/641; H01R 13/645; H01R 13/6485; H01R 13/652; H01R 13/6582; H01R 13/6595; H01R 13/7175
See application file for complete search history.

(56) References Cited

U.S. PATENT DOCUMENTS

| | | | | |
|---|---|---|---|---|
| 5,842,885 | A * | 12/1998 | Takamoto | H01R 13/6582 439/607.01 |
| 6,050,852 | A * | 4/2000 | Wu | H01R 13/629 439/607.02 |
| 6,672,887 | B1 * | 1/2004 | Yu | H01R 13/6582 439/108 |
| 6,726,492 | B1 * | 4/2004 | Yu | H01R 23/688 434/74 |
| 6,821,149 | B2 * | 11/2004 | Lai | H01R 23/6873 439/607.31 |
| 7,108,554 | B2 * | 9/2006 | Huang | H01R 23/6873 439/378 |
| 7,207,815 | B1 * | 4/2007 | Ju | H01R 12/7029 439/159 |
| 8,771,001 | B2 * | 7/2014 | Li | H01R 13/639 439/160 |
| 8,900,001 | B2 * | 12/2014 | Li | H01R 12/7005 439/157 |
| 9,065,225 | B2 * | 6/2015 | Degner | H01R 12/721 |
| 9,570,823 | B2 * | 2/2017 | Lai | H01R 12/716 |
| 9,666,971 | B1 | 5/2017 | Lai et al. | |
| 9,711,890 | B1 * | 7/2017 | Lai | H01R 13/516 |
| 9,780,512 | B2 | 10/2017 | Hsu et al. | |
| 9,837,751 | B2 * | 12/2017 | Lai | H01R 12/737 |
| 10,135,201 | B2 * | 11/2018 | Lai | H01R 12/716 |
| 2005/0095913 | A1 * | 5/2005 | Fan | H01R 13/658 439/607.35 |

* cited by examiner

CARD EDGE CONNECTOR HAVING METALLIC MEMBER FORMED INTEGRALLY WITH INSULATIVE HOUSING

1. FIELD OF THE DISCLOSURE

The invention is related to a card edge connector, and particularly to a card edge connector having a metallic member formed integrally with an insulative housing.

2. DESCRIPTION OF RELATED ARTS

A traditional card edge connector includes an elongated insulative housing, a plurality of terminals retained to the housing and two latches located at two opposite ends of the housing. The housing defines a central slot with two lengthwise walls. Each of the terminals includes a contacting section protruding into the central slot. However, the card edge connector could not afford a heavy electronic card because of the plastic structure and strength of the insulative housing.

It is desired to provide a card edge connector which could improve the strength of the housing.

SUMMARY OF THE DISCLOSURE

To achieve the above desire, a card edge connector includes an elongated insulative housing, a plurality of terminals retained to the housing, and a metallic member formed integrally with the housing via an insert-molding process. The housing includes two lengthwise walls, a central slot defining by the two lengthwise walls, and two protrusions located at two opposite ends of the two lengthwise walls. The protrusions protrude upwardly out of an upper surface of the lengthwise walls. The metallic member includes two main portions retained respectively in the two lengthwise walls and a pair of connecting portions connecting therebetween. The portions are located at the bottom of the metallic member.

DETAILED DESCRIPTION OF THE PREFERRED EMBODIMENT

Figure 1:
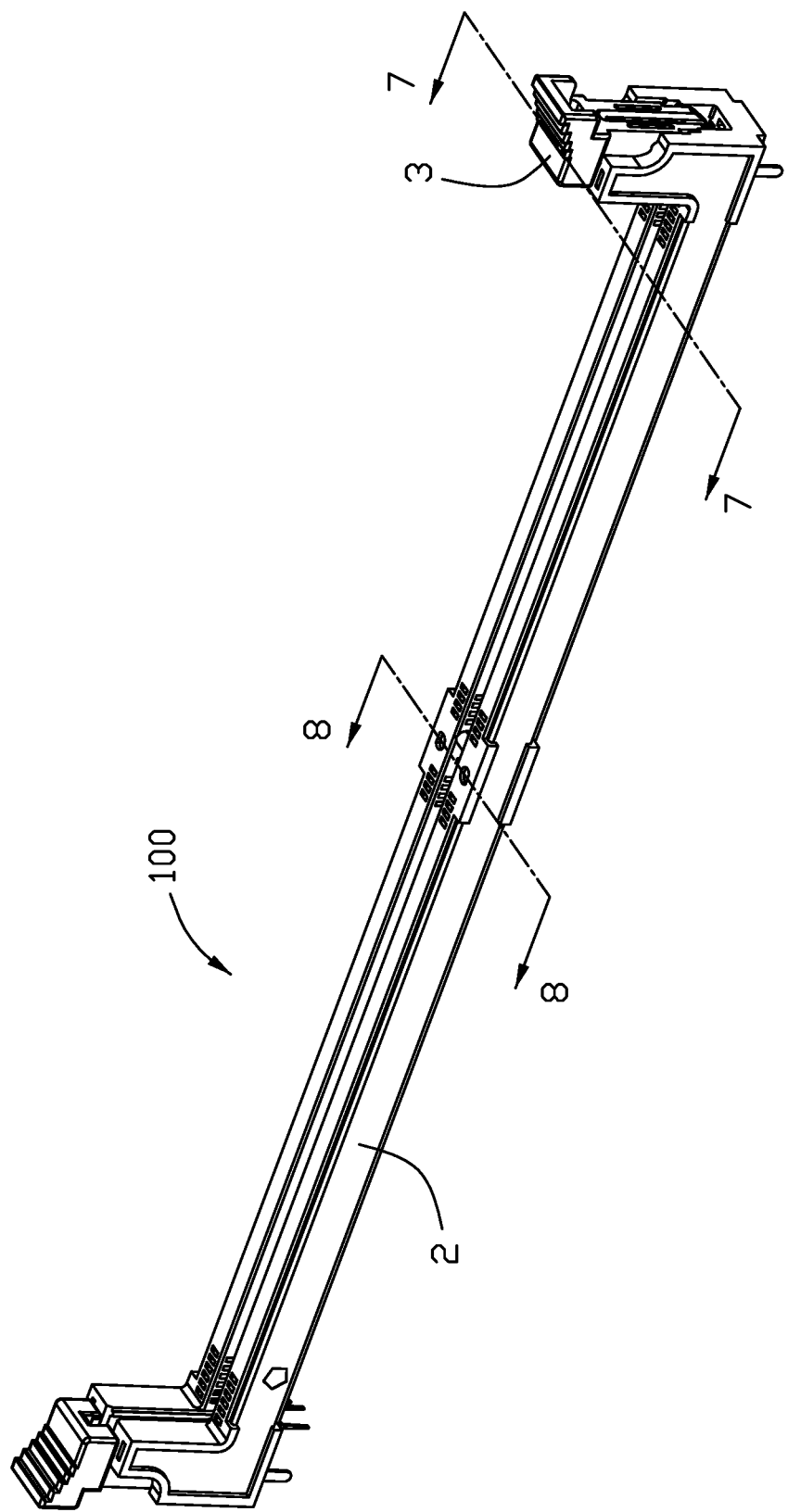
FIG. 1 is a perspective view of a card edge connector of the invention.
Figure 2:
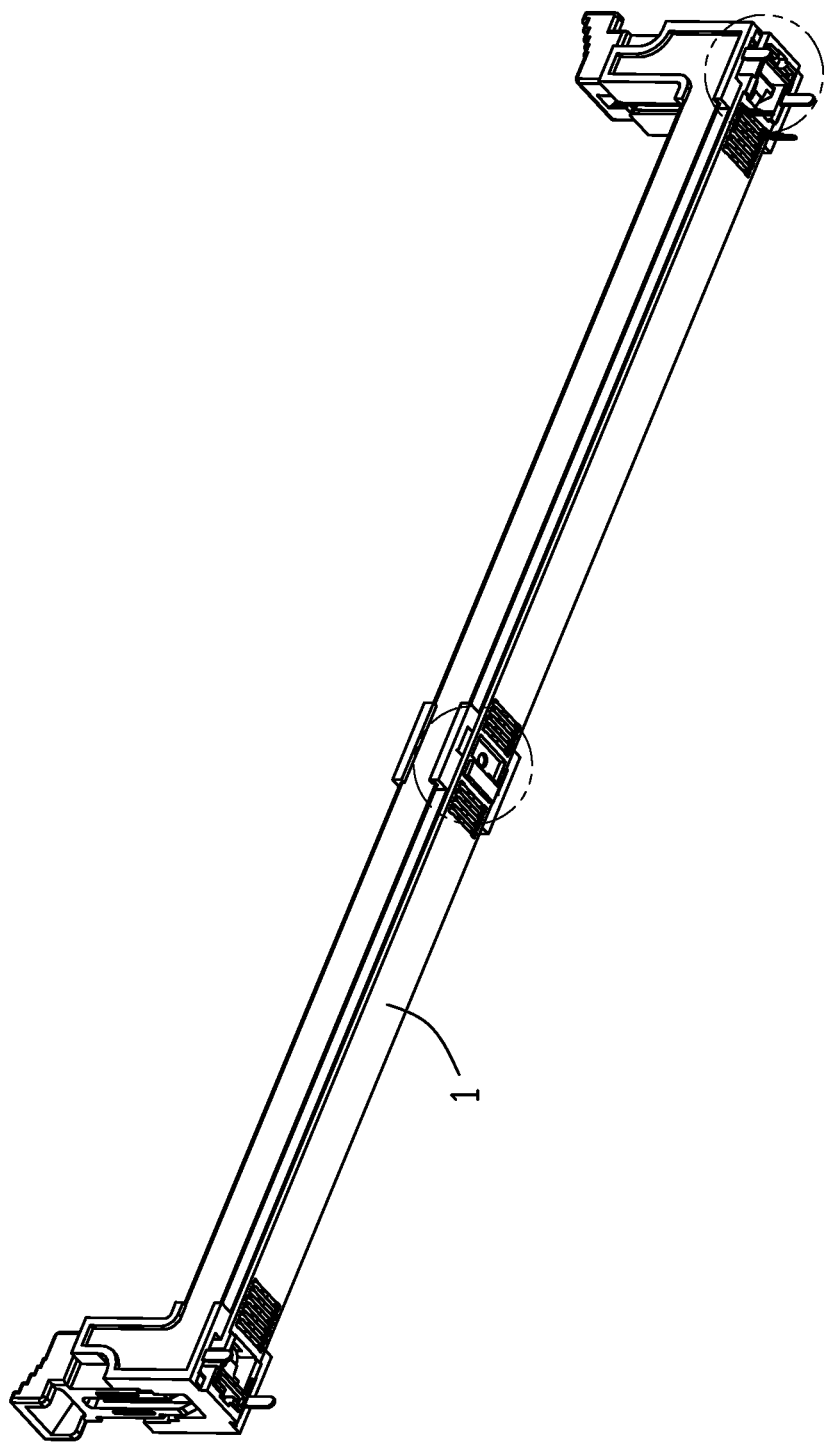
FIG. 2 is another rear perspective view of the card edge connector of FIG. 1.
Figure 3:
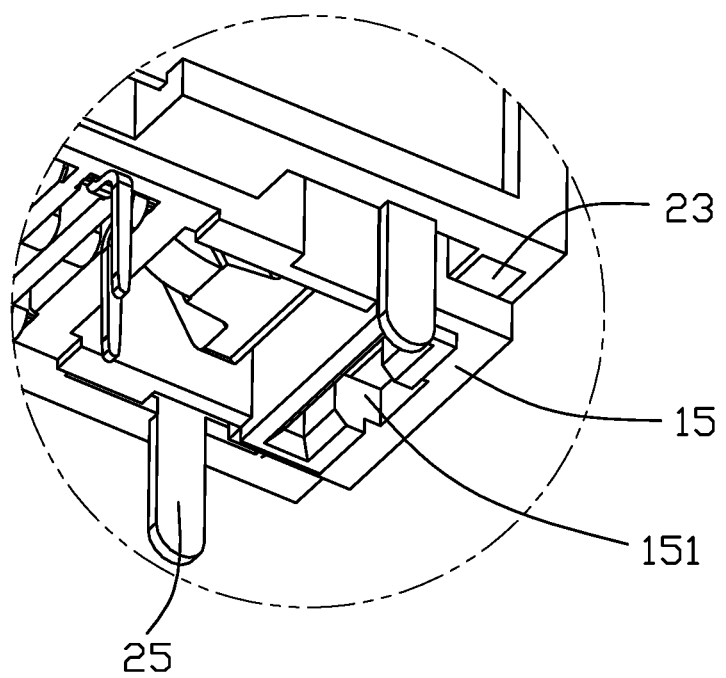
FIG. 3 is an enlarged partial perspective view of the card edge connector of FIG. 2.

Reference will now be made in detail to the embodiments of the present disclosure. Referring to FIGS. 1-6, a card edge connector 100 for connecting an electronic card (not shown) to a printed circuit board (not shown), includes an elongated insulative housing 1, two rows of terminals 4 retained to the housing 1, a metallic member 2 formed integrally with the hosing 1 via an insert-molding process, and a pair of latches/ejectors 3 pivoted rotatably to two opposite ends of the housing 1. The electronic card (not shown) includes a first cutout and a second cutout located at two opposite sides thereof. When the electronic card mounted to the card edge connector 100, the latches 3 are assembled in the first cutout.

The insulative housing 1 includes two lengthwise walls 11 extending along a lengthwise direction, a central slot 101 defined between the two lengthwise walls 11, and two protrusions 12 located at two opposite ends of the two lengthwise walls 11. The protrusions 12 protrude upwardly out of an upper surface of the lengthwise walls 11 in a vertical direction perpendicular to the lengthwise direction. The insulative housing 1 includes a key member 13 located around a middle region of the lengthwise walls 11 in the lengthwise direction. Each of the protrusions 12 includes an inner face 121 facing to the key member 13, an outer face 122 opposite to the inner face 121, two side faces 123 connecting between the inner face 121 and the outer face 122, and a gap 124 going through the inner face 122 and the outer face 122. The gap 124 communicates with the central slot 101. Each of the protrusions 12 includes a pair of first ribs 125 protruding around the side face 123. The housing 1 includes a pair of second ribs 14 protruding respectively from the middle region of the two lengthwise walls 11 and corresponding to the key member 13. Both of the first ribs 125 and the second ribs 14 hold the metallic member 2 to prevent the metallic member 2 from sliding movement.

The metallic member 2 includes two main portions 21 retained respectively in the two lengthwise walls 11, four extending portions 22 extending therefrom and located at the side faces 123 of the protrusions 12, and a pair of first connecting portions 23 connecting between the two main portions 21 at the bottom thereof. The main portion 21 includes a cutout 212 located around the middle of a top edge 211 of the main portion 21. The first connecting portions 23 are located at two ends of the metallic member 2, respectively. The metallic member 2 further includes a second connecting portion 24 connecting between the two main portions 21. The second connecting portion 24 is located below the key member 13. The second connecting portion 24 includes a hole 241 for positioning while the housing 1 and the metallic member 2 are formed integrally.

Each of the latches 3 includes two opposite bases 31, two positioning pillars 32 protruding therefrom, and an operating portion 33 located above the corresponding base 31. The protrusion 12 includes a through-hole 126 going through the two side faces 123 along a transverse direction perpendicular to both of the vertical direction and the lengthwise direction. The positioning pillars 32 are assembled to the corresponding through-hole 126 so that the latches 3 could rotate around the corresponding positioning pillars 32.

Figure 4:
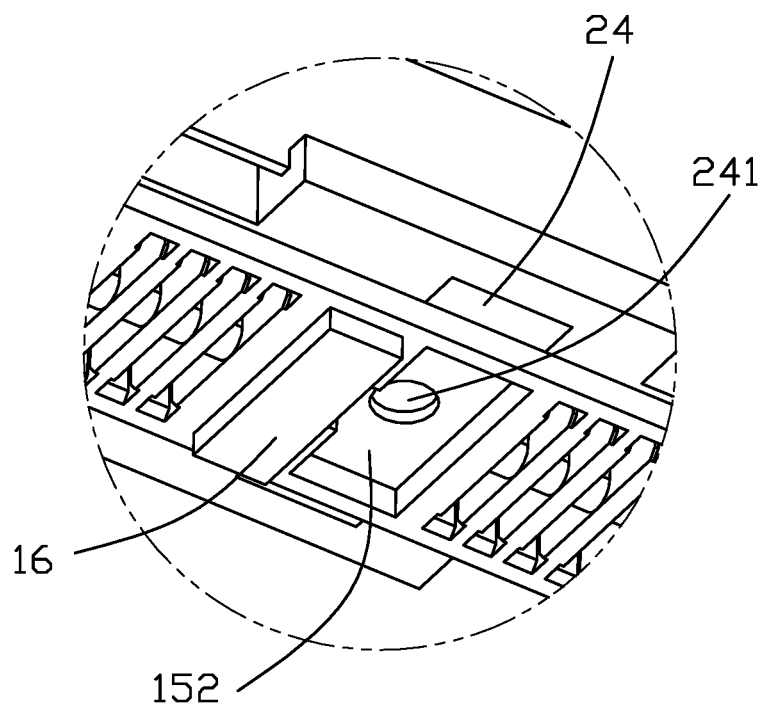
FIG. 4 is another enlarged partial perspective view of the card edge connector of FIG. 2.
Figure 5:
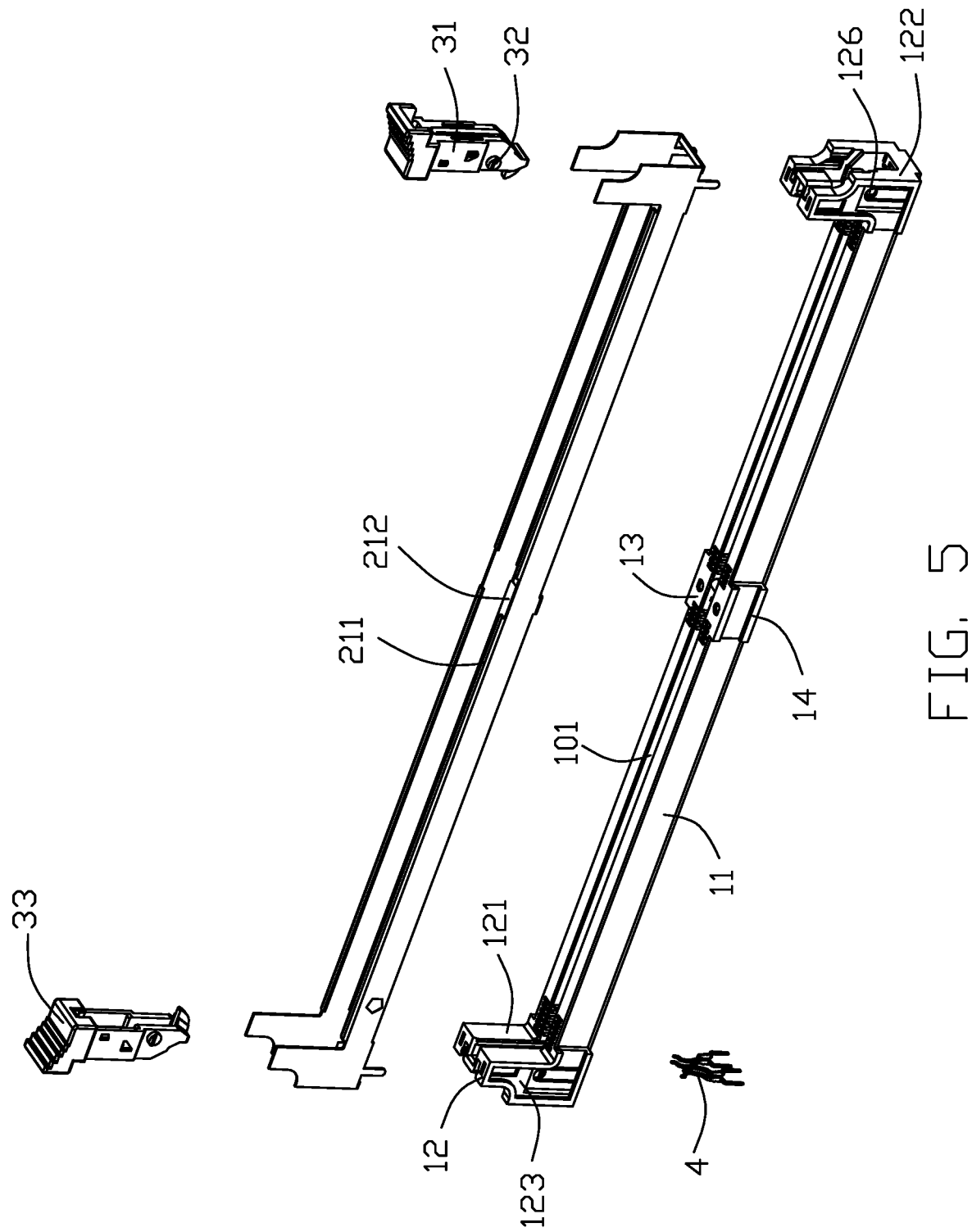
FIG. 5 is an exploded perspective view of the card edge connector of FIG. 1.
Figure 6:
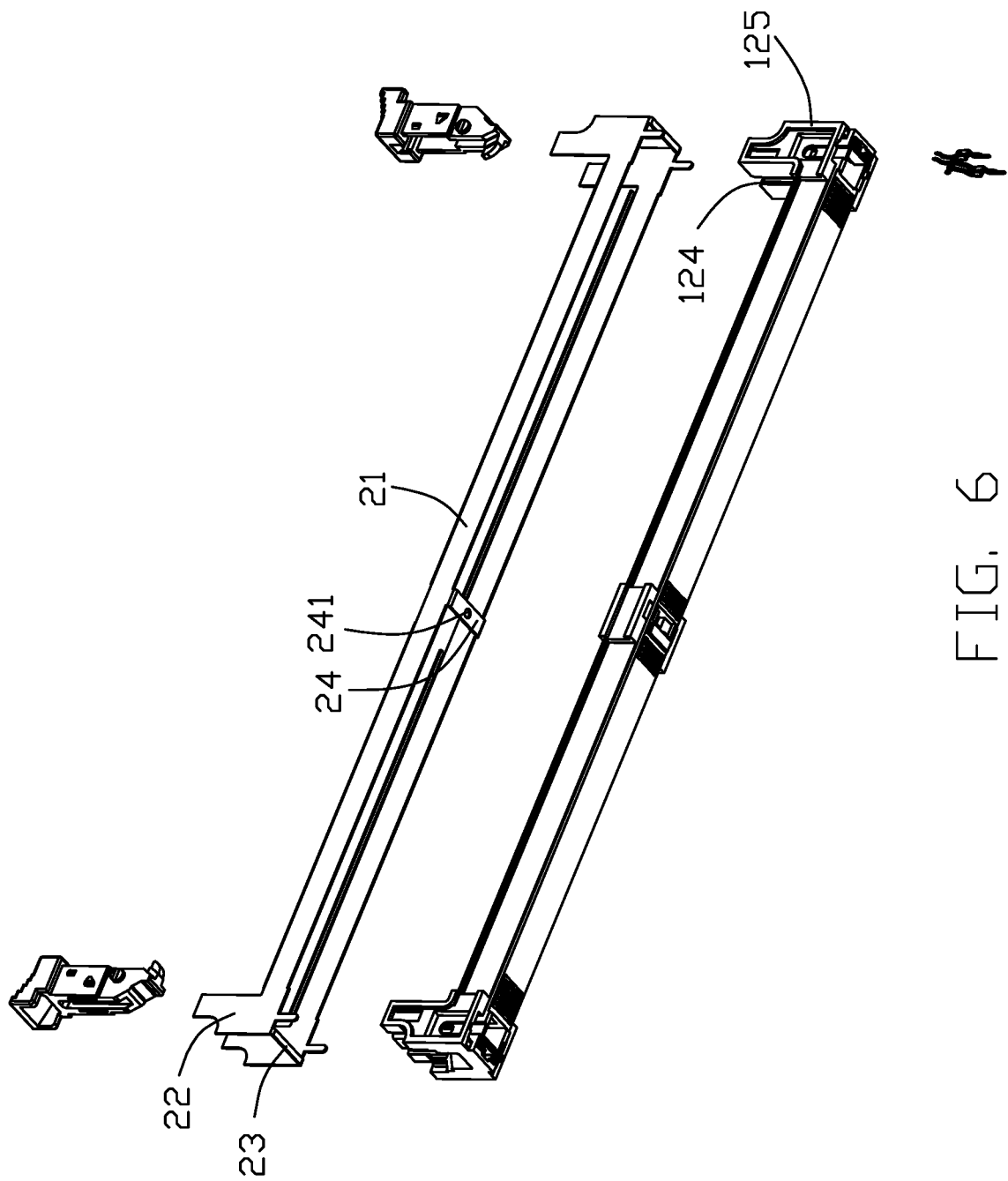
FIG. 6 is another exploded perspective view of the card edge connector of FIG. 5.
Figure 7:
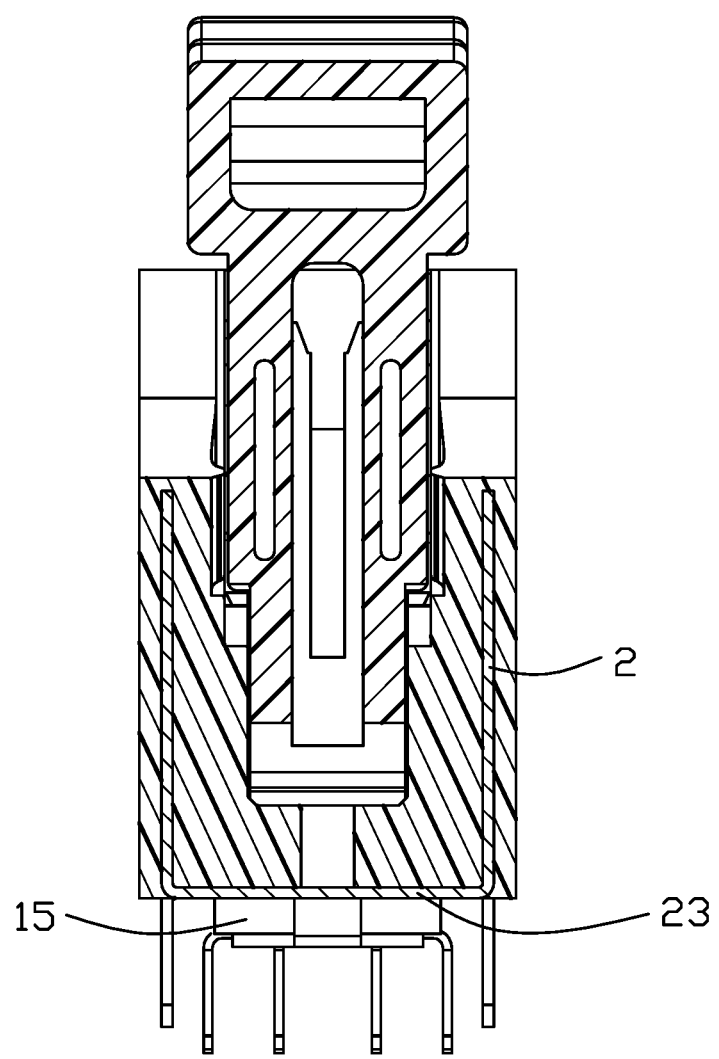
FIG. 7 is a cross-sectional view of the card edge connector of FIG. 1 taken along a line 7-7.
Figure 8:
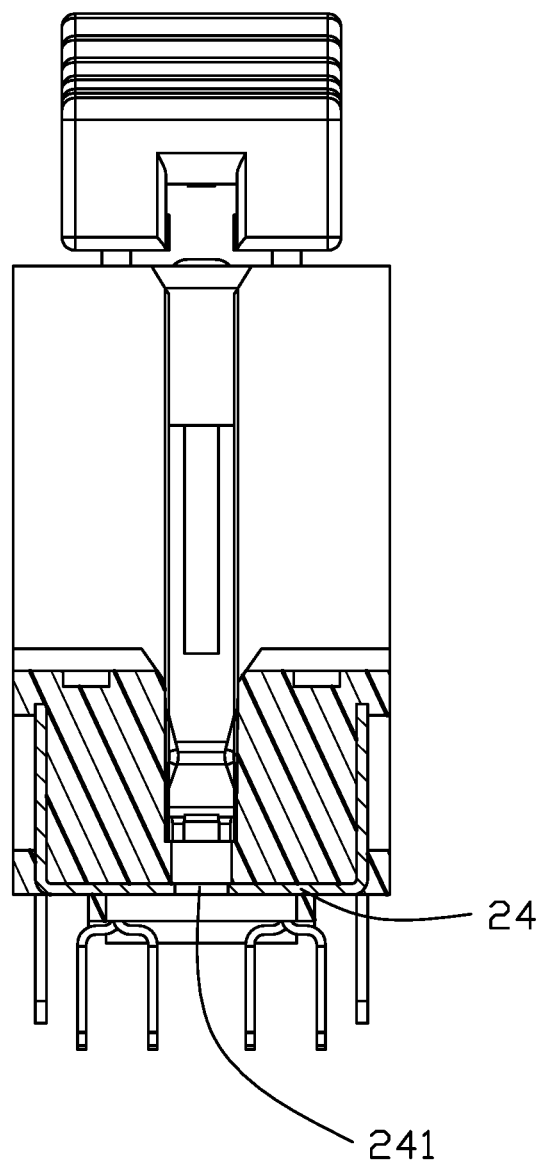
FIG. 8 is another cross-sectional view of the card edge connector of FIG. 1 taken along a line 8-8.

Referring to FIGS. 7 and 8, the housing 1 includes a protruding portion 15 protruding downwardly in the vertical direction. The protruding portion 15 includes a first groove 151 located corresponding to the first connecting portion 23 and a second groove 152 corresponding to the second connecting portion 24. The first and second connecting portions 23, 24 are buried in the protruding portion 15 and exposed partly in the first and second grooves 151, 152, respectively. The metallic member 2 includes two pairs of soldering portions 25 extending downwardly from the main portions 21. The two pairs of the soldering portions 25 are located respectively at the two ends of the main portions 21. The soldering portion 25 extends downwardly out of the protruding portion 15. Referring to FIG. 4, the housing 1 includes a bump 16 extending downwardly from the protruding portion 15. The bump 15 is neighbored to the second groove 152. Referring to FIGS. 7 and 8, the housing 1 and the metallic member 2 are formed integrally to improve the structure and the strength of the card edge connector 100. The first and second connecting portions 23, 24 are located at the bottom of the metallic member 2 and exposed out of a bottom face 102 of the housing 1.

Figure 9:
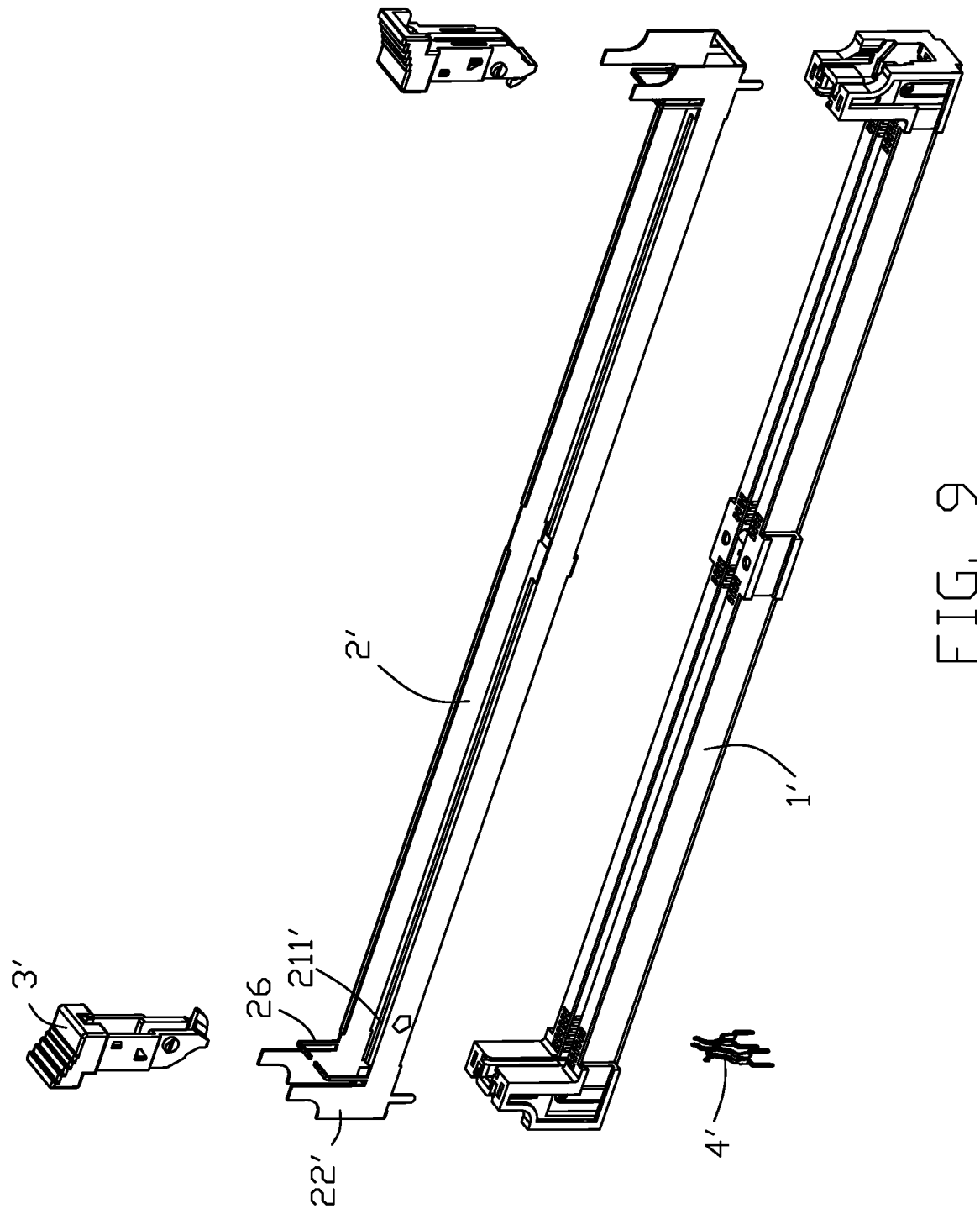
FIG. 9 is a perspective view of another embodiment of the invention.
Figure 10:
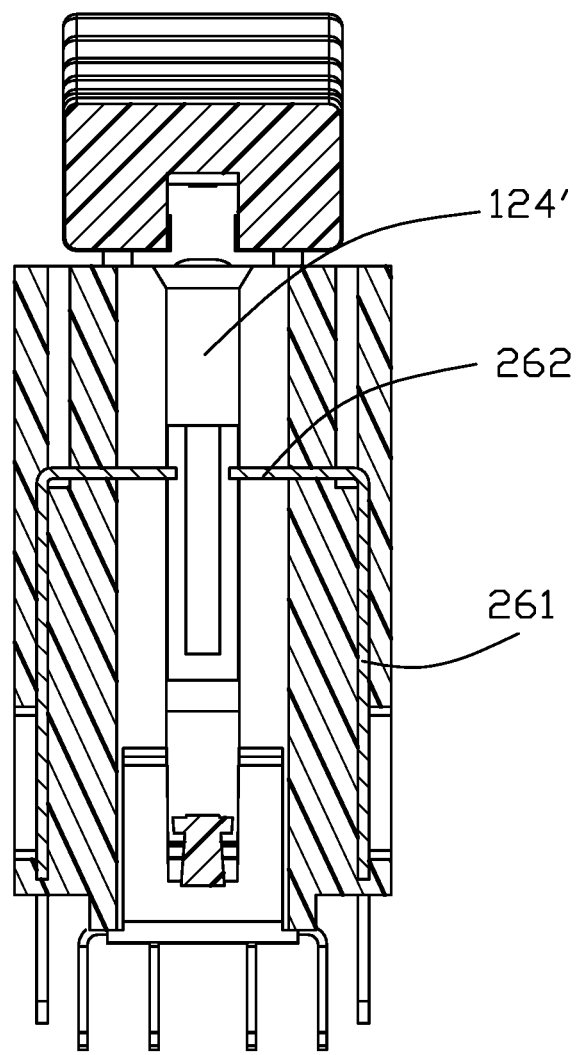
FIG. 10 is a cross-sectional view of the card edge connector of the FIG. 9.

FIGS. 9 and 10 show another card edge connector 100' of the invention. The card edge connector 100' includes an insulative housing 1', two rows of terminals 4' retained to the housing 1', a metallic member 2' formed integrally with the hosing 1' via an injection-molding process, and a pair of latches 3' pivoted rotatably to two opposite ends of the housing 1'. The housing 1', latches 3 and the terminals 4' are similar as the housing 1, latches 3 and terminals 4. The metallic member 2' includes an elastic element 26. The elastic element 26 extends upwardly from the top side and is located between the extending portion 22 and the top edge 211'. The elastic element 26 includes a holding portion 261 extending upwardly from the main portion 21' and a cantilever 262 extending into the gap 124'. The holding portion 261 and a part of the cantilever 262 are retained in the protrusion 12. The cantilever 262 bends upwardly to provide an additional retaining force to engage with the electronic card (not shown).

One feature of the invention is that the housing 1 forms a peripheral flange (not labeled) on each side of the protrusions 12 to protectively shield the edges of extending portions 22 of the metallic member 2 for preventing outward deflection of extending portions 22 of the metallic member 2 around the edges. In other words, the edges of the metallic member 2 are embedded within the peripheral flange. While a preferred embodiment in accordance with the present disclosure has been shown and described, equivalent modifications and changes known to persons skilled in the art according to the spirit of the present disclosure are considered within the scope of the present disclosure as described in the appended claims.

What is claimed is:

1. A card edge connector comprising:
   an elongated insulative housing comprising two lengthwise walls, a central slot defining by the two lengthwise walls, and two protrusions located at two opposite ends of the lengthwise walls and protruding upwardly out of an upper surface of the lengthwise walls;
   a plurality of terminals retained to the housing; and
   a metallic member formed integrally with the housing via an insert-molding process; wherein
   the metallic member comprises two main portions retained respectively in the two lengthwise walls and, a pair of first connecting portions unitarily connecting therebetween, and each of the first connecting portions extends horizontally and is located at a bottom of the metallic member and buried in a downward face of a bottom of the corresponding protrusion.

2. The card edge connector as claimed in claim 1, wherein the housing includes a key member located around a middle region of the lengthwise walls in a lengthwise direction, and the metallic member includes a second connecting portion with a hole located below the key member in a vertical direction perpendicular to the lengthwise direction.

3. The card edge connector as claimed in claim 2, wherein each of the protrusions includes an inner face facing to the key member, an outer face opposite to the inner face and two side faces connecting between the inner and outer faces, the metallic member includes two extending portions extending upwardly from two ends of the main portion, and the extending portions are retained to the side faces of the protrusions.

4. The card edge connector as claimed in claim 3, wherein the metallic member includes an elastic element extending upwardly from the main portion, and the elastic element is retained in the protrusion.

5. The card edge connector as claimed in claim 4, wherein the elastic element includes a holding portion extending upwardly from the main portion and a cantilever extending therefrom, and the holding portion is retained in the protrusion and neighbored to the extending portion.

6. The card edge connector as claimed in claim 5, wherein each of the protrusions includes a gap going through both of the inner and outer faces for communicating with the central slot, and the cantilever extends into the gap.

7. The card edge connector as claimed in claim 2, wherein each of the protrusions includes an inner face facing to the key member, an outer face opposite to the inner face, two side faces connecting between the inner and outer faces, and a pair of first ribs protruding around the edge of the two side faces.

8. The card edge connector as claimed in claim 7, wherein the housing includes a pair of second ribs protruding respectively from the middle region of the two lengthwise walls, and the first and second ribs hold the metallic member to prevent the metallic member from sliding movement.

9. The card edge connector as claimed in claim 1, wherein each of the first connecting portions is downwardly exposed to an exterior.

10. A card edge connector comprising:
    an elongated insulative housing comprising two lengthwise walls, a central slot formed between the two lengthwise walls, and two protrusions located at two opposite ends of the lengthwise walls and protruding upwardly above the lengthwise walls;
    a plurality of terminals retained to the housing; and
    a metallic member formed integrally with the housing via an injection-molding process; wherein
    the metallic member comprises two main portions retained respectively in the two lengthwise walls, and four extending portions extending upwardly from two opposite ends of the two main portions; wherein
    each of said protrusions forms a peripheral upper flange on each side, in which upper edges of the corresponding extending portions are respectively embedded for preventing outward deflection of the extending portion around said upper edge; wherein
    the two main portions are connected with each other via two end connecting portions located at two opposite ends of said two main portions; wherein
    said two end connecting portions are located at and upwardly abut against bottom faces of the corresponding protrusions in a vertical direction, respectively.

11. The card edge connector as claimed in 10, wherein the two main portions are connected with each other via center connecting portion which is located under a key member around a middle region of the housing.

12. The card edge connector as claimed in claim 10, wherein each of said main portions of the metallic member has a pair of soldering legs extending downwardly beyond a bottom face of the housing.

13. The card edge connector as claimed in claim 10, wherein each of said extending portions includes an inwardly extending cantilever for holding a memory module retained in the housing.

14. The card edge connector as claimed in claim 10, wherein a pair of pivotal ejectors are retained in the corresponding protrusions, respectively.

15. The card edge connector as claimed in claim 10, wherein each main portion further includes a pair of downwardly extending soldering portions adjacent to the corresponding connecting portions, respectively, and each soldering portion is protectively surrounded by the corresponding protrusion.

16. The card edge connector as claimed in claim 10, wherein each connecting portion further downwardly abuts against the corresponding protrusion.

17. A card edge connector comprising:
- an elongated insulative housing comprising two lengthwise walls in a longitudinal direction, a central slot formed between the two lengthwise walls in a transverse direction perpendicular to said longitudinal direction, and two protrusions located at two opposite ends of the lengthwise walls and protruding upwardly above the lengthwise walls;
- a plurality of terminals retained to the housing; and
- a one-piece unitary metallic member formed integrally with the housing via an injection-molding process; wherein
- the metallic member comprises two main portions retained respectively in the two lengthwise walls, and four extending portions extending upwardly from two opposite ends of the two main portions; wherein
- said two main portions are connected with each other via at least one connecting portion extending along said transverse direction in a horizontal plane defined by said longitudinal direction and said transverse direction; wherein
- said connecting portion is located around the corresponding protrusion and upwardly abut against a downward face of the corresponding protrusion in a vertical direction perpendicular to both the longitudinal direction and the transverse direction.

18. The card edge connector as claimed in claim 17, wherein said connecting portion is located under a key member around a middle region of the housing.

19. The card edge connector as claimed in claim 17, wherein each main portion further includes a pair of downwardly extending soldering portions adjacent to the corresponding connecting portions, respectively, and each soldering portion is protectively surrounded by the corresponding protrusion.

20. The card edge connector as claimed in claim 17, wherein said connecting portion is downwardly exposed to an exterior.

* * * * *